United States Patent [19]
Spence

[11] Patent Number: 4,706,220
[45] Date of Patent: Nov. 10, 1987

[54] NON-VOLATILE RAM CELL WITH DUAL HIGH VOLTAGE PRECHARGE

[75] Inventor: John R. Spence, Villa Park, Calif.

[73] Assignee: Rockwell International Corporation, El Segundo, Calif.

[21] Appl. No.: 829,253

[22] Filed: Feb. 14, 1986

[51] Int. Cl.⁴ .................. G11C 11/40; G11C 9/00
[52] U.S. Cl. ................................... 365/203; 365/154
[58] Field of Search ................ 365/228, 154, 203, 205

[56] References Cited
U.S. PATENT DOCUMENTS

| | | | |
|---|---|---|---|
| 4,103,348 | 7/1978 | Fagan . | |
| 4,132,904 | 1/1979 | Harari | 365/154 X |
| 4,271,487 | 6/1981 | Craycraft | 365/189 |
| 4,354,255 | 10/1982 | Stewart | 365/154 |
| 4,363,110 | 12/1982 | Kalter et al. | 365/228 X |
| 4,499,560 | 2/1985 | Brice | 365/228 |
| 4,508,980 | 4/1985 | Puar | 365/205 X |
| 4,527,255 | 7/1985 | Keshtbod | 365/154 |

Primary Examiner—Stuart N. Hecker
Assistant Examiner—Alyssa H. Bowler
Attorney, Agent, or Firm—H. Fredrick Hamann; George A. Montanye; James F. Kirk

[57] ABSTRACT

A non-volatile memory cell circuit for storing and recalling a digital signal, the memory cell circuit having a store cycle having a repeating series of recurring store cycle sequences; each store cycle sequence being controlled by an HIV Signal and a STORE SIGNAL. The memory cell circuit also has a recall cycle controlled by a MEMORY RESET SIGNAL to preset the state of the memory cell circuit during a first interval, a RECALL OUTPUT CONTROL SIGNAL and a RECALL TRANSFER SIGNAL in a second reset signal interval. The memory cell has a VOLATILE RAM CELL with a flip-flop having first and second nodes at which complementary output signals are provided. The flip-flop also has a SET TERMINAL responsive to a set signal for forcing the flip-flop to assume a predetermined state coupled to the first node and a RESET TERMINAL responsive to the RESET SIGNAL. A NON-VOLATILE RAM element is included having a first capacitor, a second capacitor, and first and second rectifier means responsive to the HIV signal for simultaneously precharging the first and second capacitors. The NON-VOLATILE RAM element also has a charge storage memory responsive to the charge state of the first and second capacitors for storing a state corresponding to the state of the flip-flop into a non-volatile charge storage element.

9 Claims, 23 Drawing Figures

NON-VOLATILE RAM CELL WITH DUAL HIGH VOLTAGE PRECHARGE

RELATED CASES

This application is related to two previously filed applications, i.e. application Ser. No. 745,746, filed June 17, 1985, entitled "NON-VOLATILE RAM CELL WITH CHARGE PUMPS", and application Ser. No. 801,650, filed Nov. 25, 1985, entitled "NON-VOLATILE RAM CELL WITH SINGLE HIGH VOLTAGE PRECHARGE", all referenced cases having the same assignee.

FIELD OF THE INVENTION

This invention relates generally to electronic memory circuitry and pertains particularly to non-volatile random access memory.

BACKGROUND OF THE INVENTION

Electronic semiconductor memories are used in computers and other devices for storing information. The information is encoded into binary bits, which are stored in cells of the memory, with the value of each bit being represented by the electrical state of a cell. An electronic memory may be of the random access type, which readily allows changes to be made in the stored information, or of the read only type, which does not.

A computer is supplied with power from an external source, such as a battery or a connection to a utility power line. The power supplied to the computer generally is also supplied to the memories within the computer. For many applications, it is desirable that the information stored in a memory not be lost when the source of power (i.e. battery or utility power) is disconnected from the memory. For example, if a lengthy program is stored in a computer memory, it may be desirable that the program not be lost when the computer power is shut down, so that the program will be present in the memory when the computer power is turned on again. Memories that maintain their contents after loss of power are termed "non-volatile." Ferrite core memories are exemplary of non-volatile memories.

Memories that lose their contents after loss of power are termed "volatile". Semiconductor random access memories (RAMs) made using simple MOSFETs (metal oxide semiconductor field effect transistors) are exemplary of volatile memories. Generally, volatile memories are capable of high speed, low power operation, whereas non-volatile random access memories (NVRAMs) require more power and operate at lower speeds. Various specialized electronic semiconductor memories, including electrically-alterable read only memories (EAROMs) or electrically erasable programmable read only memories (EEPROMs), have been made to allow in-circuit changes in the data stored in read only memories. However, such devices generally require large amounts of time for reprogramming.

Others have recognized the need to combine the speed and low power consumption of a typical MOSFET RAM with a non-volatile memory capability. A reference discussing several possible solutions is U.S. Pat. No. 4,271,487, issued June 2, 1981 to Donald G. Craycraft et al, and assigned to NCR Corporation. That patent describes three circuits that are associated with a conventional volatile RAM element to provide non-volatile memory associated with each RAM element. Each of those circuits includes a pair of non-volatile capacitors for storing charges representative of the memory element state to be stored. Each non-volatile capacitor is connected to one of the output nodes of the volatile memory cell and includes a threshold alterable portion. When the state of the volatile RAM element is stored in the non-volatile capacitors, the threshold of the threshold-alterable portion of one or the other of the capacitors is altered, depending on the state being stored. When the power is again connected to the memory cell, and the state stored in the non-volatile portion is to be re-transferred to the volatile element, the threshold-alterable portion is turned on in one capacitor, and in the other capacitor the threshold portion is kept off, causing the two capacitors to present different capacitances to the two volatile RAM output nodes. As a result, the voltage of the two output nodes will rise at different rates. This difference in the rate of voltage rise causes the volatile portion of the element to assume the state represented by the stored charges.

The component values and tolerances for the capacitive volatile/non-volatile RAM cell of this type must be very carefully controlled to insure that the proper capacitance is applied to the cell so that the state of the cell is accurately stored on the non-volatile element and, more critically, accurately read out from the non-volatile element onto the volatile element. Slight changes or inaccuracies in the storage capacitors may result in an undesirable change in the rate of voltage rise for one or both sides of the volatile memory element, leading to inaccuracies in rewriting the volatile element.

SUMMARY OF THE INVENTION

Therefore, it is an object of this invention to provide a non-volatile random access memory providing accurate, high-speed, low power operation.

Another object of this invention is to provide a semiconductor memory requiring relatively few and compact components so that the memory circuitry may readily be incorporated in a high density integrated circuit chip.

A further object of the invention is to provide, in a memory cell incorporating a high speed volatile RAM cell with an associated non-volatile cell, direct and positive transfer of the state of the non-volatile cell to the volatile cell.

Yet another object of the invention is to provide reliable transfer of data between a volatile RAM cell and an associated non-volatile memory cell using a minimum of power.

The memory cell circuit of the invention includes a volatile RAM flip-flop that has first and second stable states and means for establishing the flip-flop in its first stable state. The memory cell further includes a non-volatile RAM element having two states. To non-volatilely store a data bit according to the invention, a state representative of the data bit to be stored is established in a volatile flip-flop memory cell having two stable states. A transfer circuit connected to the flip-flop and to the non-volatile RAM element causes the flip-flop to either retain its established first state or flip to its second state in response to the state of the non-volatile RAM element. Preferably, the non-volatile RAM element includes a terminal that is caused to have a predetermined voltage when the non-volatile RAM element is in its second state, corresponding to the second state of the flip-flop. In a RECALL sequence, the transfer circuit selectively connects the volatile element to the terminal, after the flip-flop has been established in its first state, so that when the terminal has the predetermined voltage the flip-flop changes to its second state.

The non-volatile RAM element retains the state to be stored in a charge storage element The charge storage element is preferably a floating gate MOSFET, and the memory cell circuit additionally includes rectifier means having first and second rectifier elements, respectively connected to first and second plates of the charge storage element. Each of the charge storage element plates are capacitively coupled to a reference potential such as ground. The rectifiers are simultaneously turned on to apply a high voltage pulse to both plates of the charge storage element. The flip-flop output operates to discharge the capacitor on one of the charge storage element plates thereby placing a voltage difference on the plates and transferring a charge on the floating gate to place the non-volatile element in a state determined by the previous state of the flip-flop.

To retrieve the non-volatilely stored bit, a predetermind one of the flip-flop stable states is established in the flip-flop. Then the charge on the charge storage element is sensed by a sense element to cause the volatile cell to either flip state of the flip-flop or to allow it to remain in its established predetermined state, depending on the charge stored on the charge storage element.

DESCRIPTION OF THE PREFERRED EMBODIMENT

Figure 1:
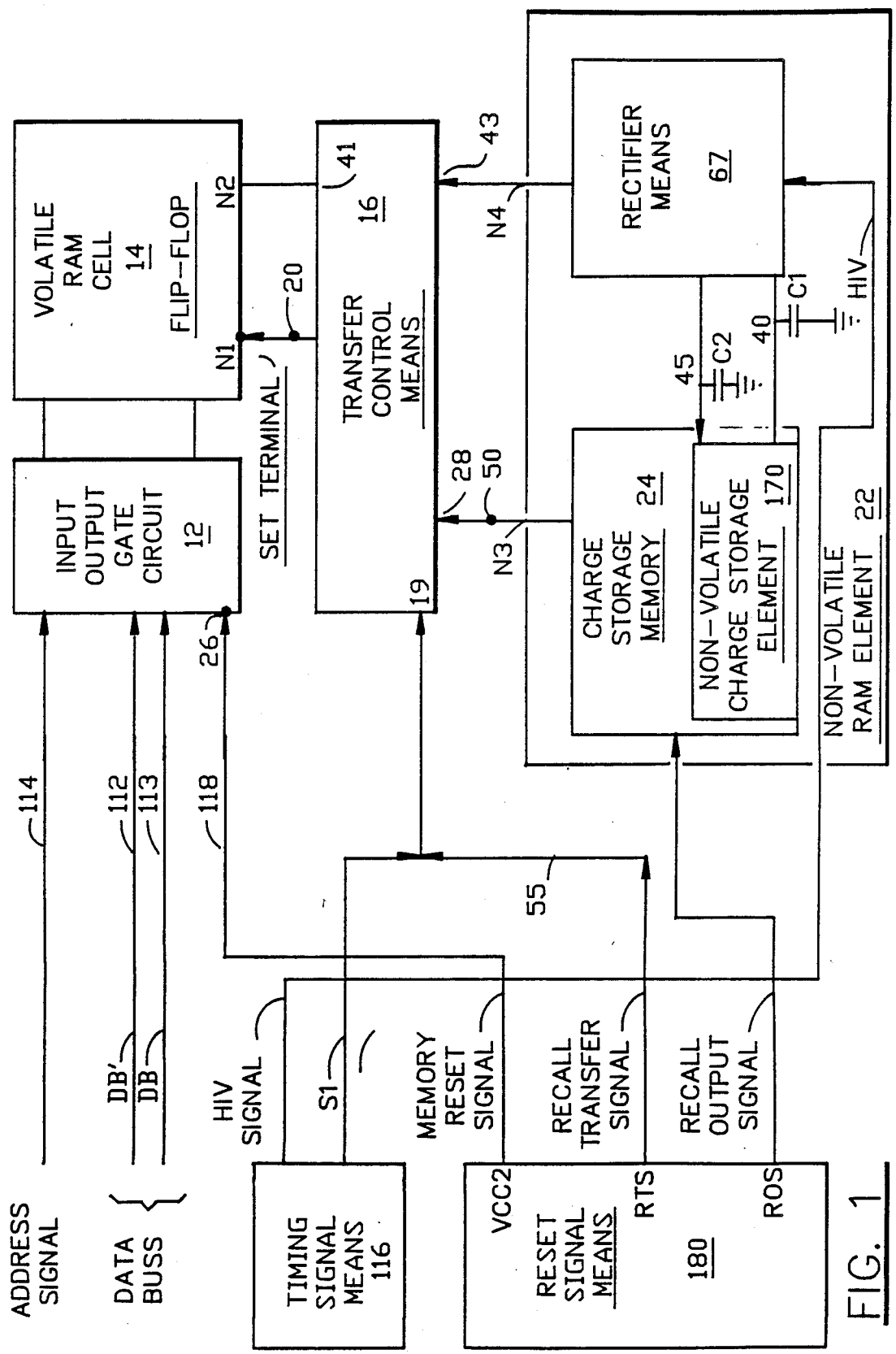
FIG. 1 is a block diagram of the NON-VOLATILE RAM CELL.

Referring first to the block diagram of FIG. 1, the non-volatile random access memory (RAM) cell 10 allows for the storage and retrieval of data in the form of electrical signals transferred to and from an external data bus having bus lines DB 113 and DB 112. The cell 10 has an input/output gate circuit 12, a VOLATILE RAM CELL 14, a TRANSFER CONTROL MEANS 16, and a NON-VOLATILE RAM ELEMENT 30.

The Gate Circuit 12

Figure 2:
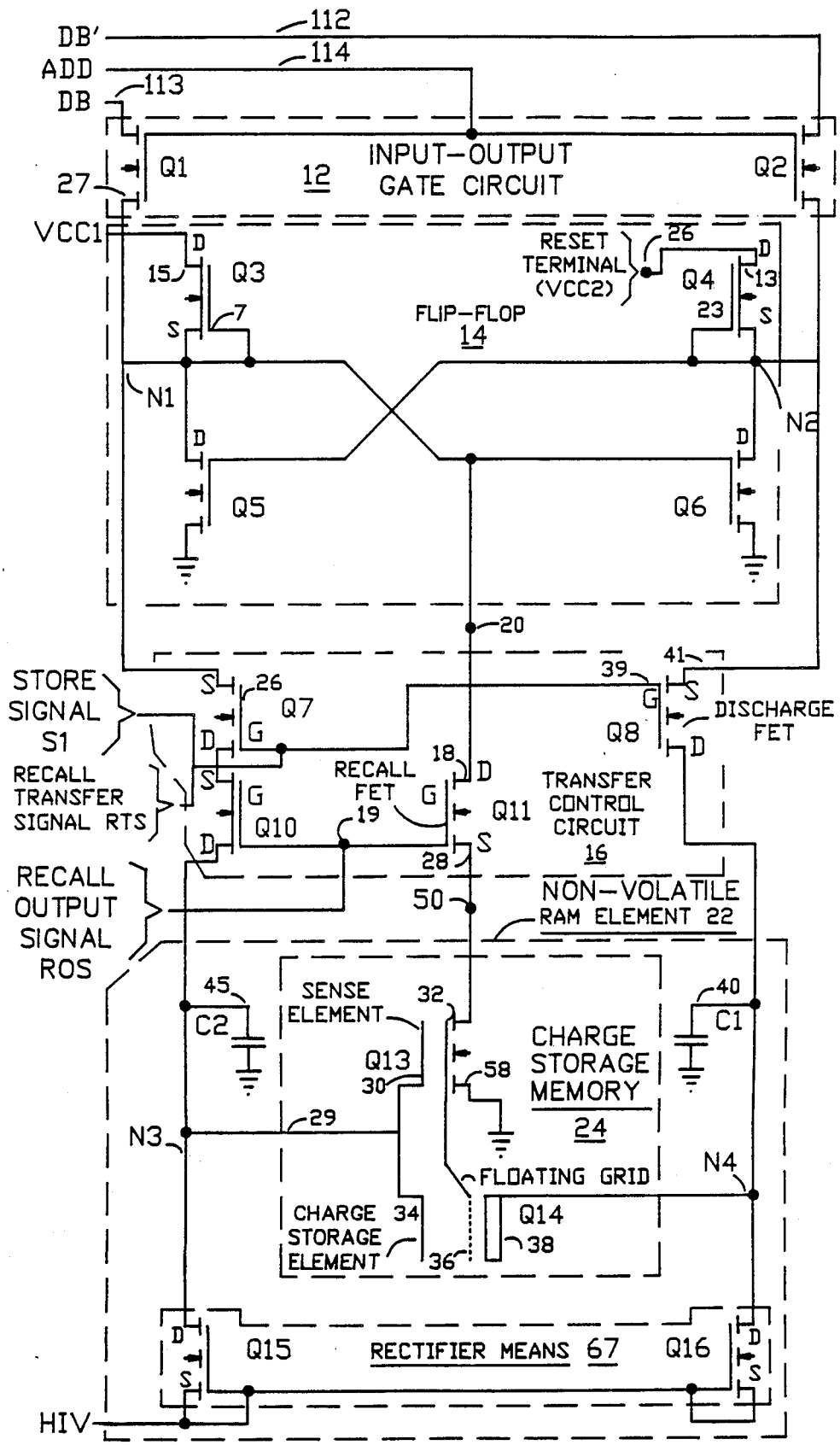
FIG. 2 is an electrical schematic drawing of the circuitry for the preferred embodiment of the non-volatile (random access memory) cell.

Referring to FIG. 2, the input/output gate circuit 12 controls the transfer of data to and from the volatile RAM element 14. The gate circuit 12 is conventional and includes addressing transistors MOSFETs Q1, Q2 having their gate electrodes connected to an external ADDRESS signal line. Transistor Q1 has its channel connected between a data bus line (DB) 113 and a first node N1 of a volatile RAM element 14. The transistor Q2 has its channel connected between an inverted data bus line (DB) 112 and a second node N2 of the VOLATILE MEMORY ELEMENT 14. Thus, an external computer data bus circuit can be connected to the memory cell by the lines DB and DB'.

External electrical addressing signals may be applied to the ADDRESS line ADD 114 to turn the transistors Q1 and Q2 on and off and thus control the transfer of data to and from the memory cell. The addressing transistors Q1, Q2 are preferably enhancement mode n-channel MOSFETs. The transistors Q1, Q2 are off (or non-conductive) when the ADDRESS line 114 is zero volts, and are on (or conductive) when the ADDRESS line is approximately five volts. When the addressing or gate transistors Q1, Q2 are off, electrical signals do not flow between data bus line DB and a first node N1 of the memory, nor between the inverted data bus line DB' and a second node N2 of the memory. When the transistors Q1, Q2 are on, electrical signals are allowed to flow back and forth between the line DB and the first node N1, and between the line DB' and the node N2.

The Volatile Memory Element 14

The volatile RAM element 14 is substantially similar to a conventional static RAM having two stable states and two output nodes N1, N2. Each stable state of the volatile element 14 represents one of the two possible states for the bit stored in that element.

In one stable state, the voltage on the first node N1 is high relative to the voltage on the second node N2. This state will be referred to as a LOGIC "1". In the other stable state of the volatile memory element 14, the voltage on the first node N1 is low relative to the voltage on the second node N2. This stable state will be referred to as a LOGIC "0". The state of the memory cell is determined by the transistors Q3, Q4, Q5, Q6, which are controlled by the signals received on the data bus lines DB, DB'.

In its preferred form, the volatile RAM element 14 uses n-channel depletion mode MOSFETs for FETs Q3 and Q4, and n-channel enhancement mode MOSFETs for FETs Q5 and Q6. The MOSFET Q3 has its channel connected between a first voltage source line VCC1 and the first node N1, and has its gate connected to the node N1. The MOSFET Q4 has its channel connected between a second voltage source line VCC2 and the second node N2, and has its gate connected to the node N2. The MOSFET Q5 has its channel connected between the first node N1 and ground, and has its gate connected to the second node N2. The MOSFET Q6 has its channel connected between the second node N2 and ground, and has its gate connected to the first node N1.

The first voltage supply line VCC1 is typically maintained at approximately five volts. The second voltage supply line VCC2 is also kept at approximately five volts, except at a time just before the state of the non-volatile RAM element 30 is recalled, as is discussed below in connection with FIG. 5 and the RECALL operation.

In the first stable state for the volatile element 14, in which the voltage on the first node N1 is high, a logic "1" state, relative to the second node N2, the depletion MOSFET Q3 is on, so the voltage of the first node, N1 is pulled high to the potential of the voltage source line VCC1. The enhancement MOSFET Q6 is turned on to pull the second node N2 to ground potential. MOSFET Q6 has a relatively low impedance in its "on" or conductive state compared to the relatively high impedance of second depletion FET Q4.

In the second stable state for the volatile element 14, in which the voltage on the second node N2 is high, a LOGIC "0" state, and relative to the first node N1, MOSFET Q4 is on, and the voltage of the second node N2 follows the potential of the second voltage supply line VCC2. The MOSFET Q5 is turned on by application of the raised voltage on the second node, Q5 conducts N2 to its gate drawing the voltage of the first node, N1, to ground.

The state of the volatile memory element 14 may be changed by applying voltages to the data bus lines DB and DB', forcing one high and the line low and gating the voltage signals to the nodes N1 and N2 by placing an address enable signal on the ADDRESS line add 118 to turn transistors Q1, Q2 on. The state of the volatile element 14 may be sensed by placing an address enable signal on the ADD line to turn transistors Q1, Q2 on, and then sensing the voltage produced on the lines DB' 113 and DB 112.

When the voltages on the supply lines VCC1 and VCC2 are both made zero, as when the power is removed from the cell, the stable state of the element 14 is not maintained and the information contents of the element 14 is lost establishing the volatility of the RAM element 14.

The Transfer Control Circuit 16

The transfer control circuit 16 controls the back-and-forth transfer of electrical signals between the volatile memory element, flip-flop 14 and the non-volatile memory element 22. The control circuit 16 acts as three gates, two of which control the transfer of information from the volatile element 14 to the non-volatile element 22, and the third of which controls the transfer of information from the non-volatile element 22 to the volatile element 14. Those gates are controlled by external electrical signals applied to the lines STORE SIGNAL S1 and RECALL OUTPUT SIGNAL (ROS).

A first gate of the transfer control circuit 16 comprises an n-channel enhancement mode MOSFET Q7 having its channel connected in series with the channel of depletion FET Q10 between the first node N1 of the volatile RAM element 14 and a node N3 of the non-volatile element 22. This first transfer control gate governs the transfer of the state of the first node N1 of the volatile element 14 to the third node N3 in the non-volatile element 22 during the storing of the state of the volatile element in the non-volatile element.

A second gate of the transfer control circuit 16 controls the recall of the state of the non-volatile memory element 22 to the volatile memory element 14. The gate includes an enhancement mode MOSFET Q11 connected between the first node N1, of the volatile element and the charge storage memory output terminal 50 of the non-volatile element.

The output terminal 50 of the non-volatile element 22 is connected to a sensing transistor Q13, which is responsive to a storage transistor Q14 to indicate the state stored in the non-volatile element, as will be described below in connection with the detailed description of the non-volatile element 22.

A third gate of the transfer control circuit 16 includes an enhancement mode MOSFET Q8 having its channel connected between the second node N2 of the volatile element and a fourth node N4, in the NON-VOLATILE RAM ELEMENT 22. The third gate controls the transfer of the state of the second node N2 to the fourth node N4 to store the state of the volatile element 14 in the non-volatile element 22.

Thus, the first and third gates control the transfer of the state of the volatile memory element 14 to the non-volatile memory element 22 during the STORE operation. The second gate governs the transfer of the state of the non-volatile element 22 to the volatile element 14 during the RECALL operation.

Each gate may include additional depletion transistor for layout convenience in constructing the memory circuit if they serve no functional purpose.

The gates of the MOSFETs Q7, Q8 are connected in parallel to the STORE SIGNAL S1 so signals on the STORE line 52 can control their operation. The gates of Q7 and Q8 are also driven by the RECALL TRANSFER SIGNAL RTS on line 55 to control their operation in RECALL. The gates of the MOSFETs Q10, Q11 are connected in parallel to the line RECALL OUTPUT SIGNAL, ROS, to control the operation of those MOSFETs in the RECALL sequence.

The signals on the STORE and RECALL lines operate the transfer control circuit 16 to govern the transfer of information between the volatile element 14 and non-volatile element 22 of the RAM cell 10. The operation of the transfer control circuit during the store and recall operations will be explained below in connection with FIGS. 3, 4 and 5.

The Non-volatile Memory Element 22

The state of the memory cell 10 can be retained for extended periods of time in the non-volatile memory element 22. The non-volatile element 22 retains its state when power is removed from the circuit, unlike the volatile memory element 14, which loses its state when the power is removed from the voltage input lines VCC1, VCC2. The non-volatile element 22 has two states, which correspond to the two states of the volatile element 14.

The non-volatile RAM element 22 includes a charge storage memory 24 for retaining a charge representative of the state of the memory cell.

The charge storage memory 24 has two nodes N3, N4, a charge storage element Q14, and a sense element Q13. The charge storage element Q14 and the sense element Q13 are preferably floating gate n-channel enhancement mode MOSFETs. The state of the volatile element 14 to be stored in the memory 24 is received through the transfer control circuit 16 onto the nodes N3, N4. To recall the state of the non-volatile memory 22 to the volatile element 14, the state of the memory 24 is output from output terminal 50 through the transfer control circuit to node N1 of the volatile element 14.

Figure 7:
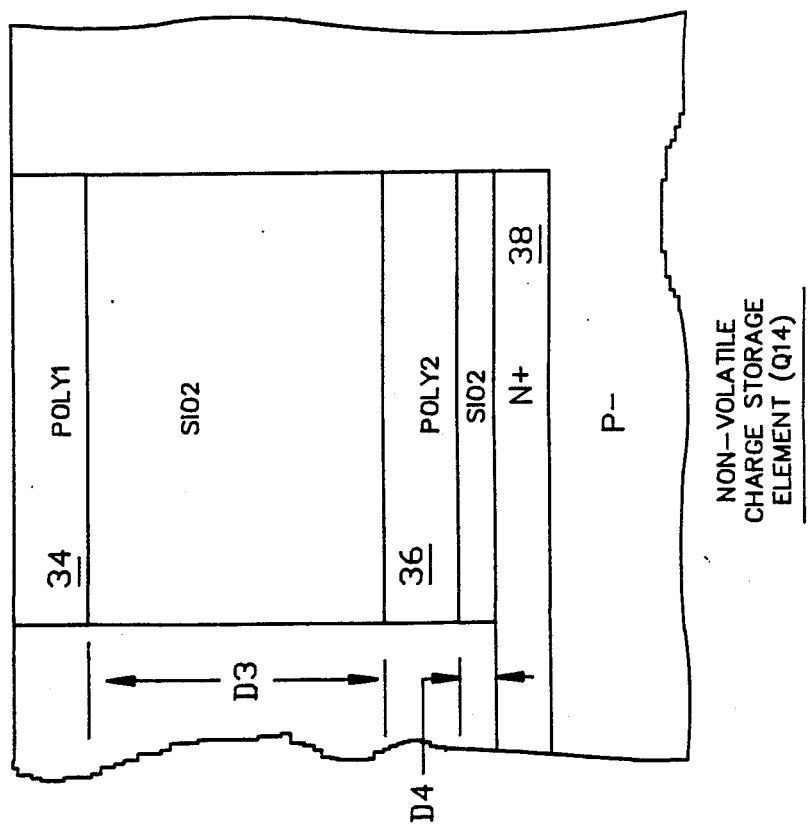
FIG. 7 is a cross section of the structure of the storage element, Q14.

Referring to FIG. 7, the non-volatile charge the storage element Q14 has a control gate 34 and a floating gate 36 between the control gate 34 and the diffusion 38. The $SiO_2$ dielectric between the floating gate 36 and the diffusion 38 is very thin (approximately 100 Angstroms), so charges can be readily moved between the floating gate and the diffusion. A charge is stored on the floating gate of the charge storage transistor Q14 by applying a relatively high voltage (approximately 20 volts) between the control gate 34 and the diffusion 38.

Figure 8:
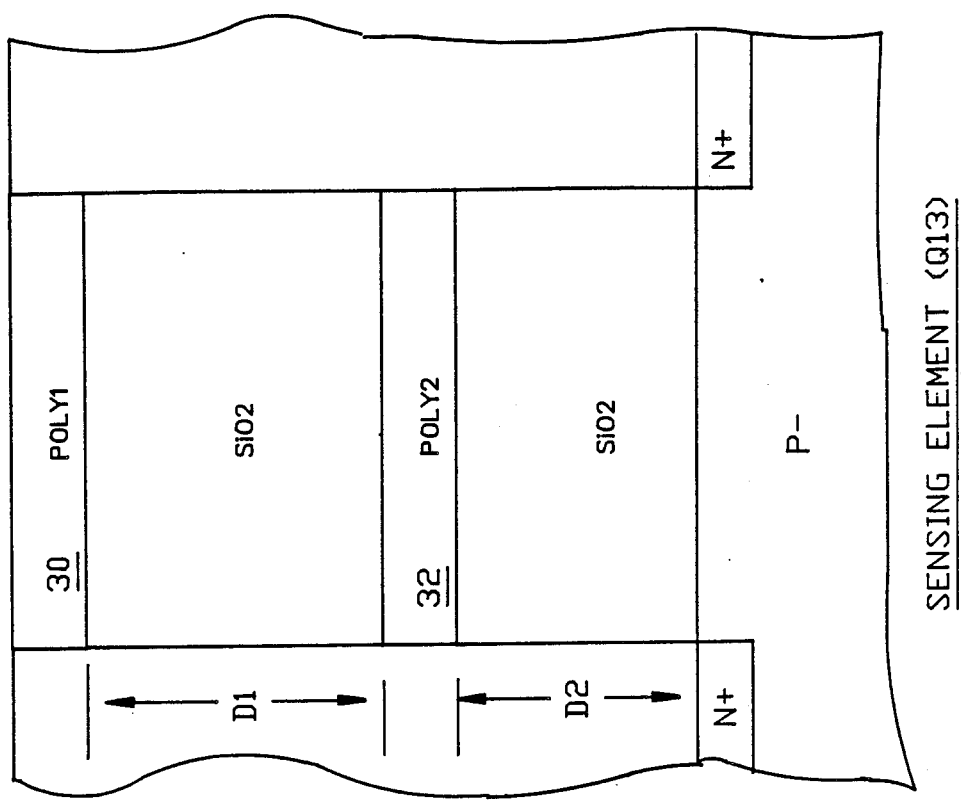
FIG. 8 is a cross section of the structure of the sense element, Q13.

Referring to FIG. 8, the sensing element Q13 has a control gate 30, a channel connected between the output terminal 50 and a predetermined voltage, preferably ground potential, and a floating gate 32 between the control gate and the channel. The floating gate 32 of the sense element Q13 is connected to the floating gate 36 of the storage element Q14 so the charge stored on the floating gate of the non-volatile charge storage element is transferred to the floating gate of the sense element. The charge on the floating gate 32 changes the threshold at which the sensing transistor Q13 is rendered conductive. For example, if a negative charge has been stored on the floating gate 36 of the storage element Q14 and transferred to the floating gate 32 of the sensing element Q13, a larger positive voltage must be applied to the gate 30 to cause the channel of the transistor Q13 to be conductive than would be the case if a positive charge were stored on the floating gate 32. As will be explained, that ability to alter the threshold voltage allows the sensing element Q13 to transfer the state of the charge storage element Q14 to the volatile element 14.

The Store Operation
LOGIC "0" STORE SEQUENCE

Figure 3:
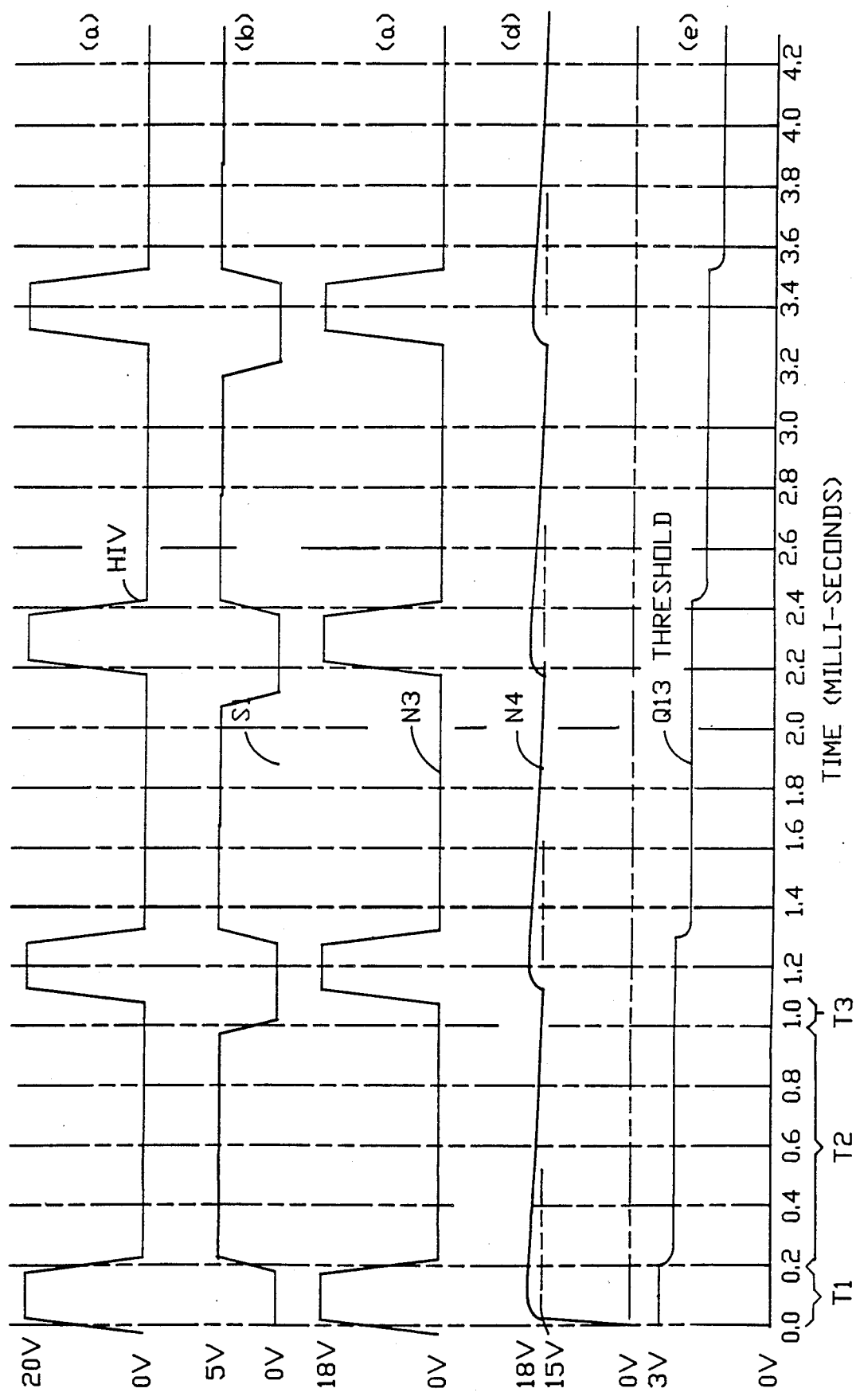
FIGS. 3(a)-3(e) are timing waveforms for the store cycle in which the flip-flop is initialized to store a LOGIC "0" and in which the voltage axis is displayed vertically and the time axis is displayed horizontally.

FIG. 3 shows Signal HIV (waveform (a)) assuming a high voltage of 20V during a first interval T1 from t=0.0 to t=0.2 ms and zero volts, 0.0 V during a second interval T2 from t=0.2 ms to t=1.0 ms. Waveform (b) shows signal S1 remaining at zero volts during T1 and rising to 5.0 V during the T2 interval. By way of example, assume that the VOLATILE RAM CELL 14 is preconditioned to store a logic "0" and is in a stable condition with a logic "1" (+5 Vdc) at node N2 and a logic "0" (0.0Vdc) at node N1.

Node N1 is common to the source 41 of Q7. FET Q7 and FET Q8 are off (non-conductive) during the first store interval T1 because their gates 26 and 39 are at 0.0 Vdc by virtue of being coupled to the signal S1, waveform (b), which is at 0.0V during this interval. With HIV at +20V, and with Q7 and Q8 acting as open switches, current flows via RECTIFIER MEANS 67 MOS rectifiers Q15 and Q16 to nodes N3 and N4 charging the first plate 40 of MOS Capacitor C1 and the first plate 45 of MOS capacitor C2 to a positive voltage of one VTH below +20 V (typically 18 V). The rise in voltage of nodes 3 and 4 from 0.0 V to +18 V is characterized by waveform (c) and (d) of FIG. 3 during this first 0.2 ms interval. The second plate 44 of MOS Capacitors C1 and C2 are at a reference potential such ground.

Since both first and second plates 34, 38 of the storage element Q14 are respectively coupled to the respective rise in voltage on C1 and C2 during T1, only a small voltage difference is developed between the storage first plate 38 and second plate 34 during this first 0.2 ms interval. Charge movement onto or off of dielectrically isolated grid 36 is not accomplished during this T1 interval since the small voltage difference between the plates is insufficient to provide the requisite electric field for programming.

FIG. 3 shows that signals HIV waveforms (a) and the voltage at N3 waveform (c) respectively return to zero volts during a second interval T2 from 0.2 ms to 0.6 ms. The drop in voltage of waveform (c) during interval T2 will be explained in connection with the discharge of C2.

Waveform (d) shows an initial rise in the voltage at node N4 to 18 V at the onset of interval T1. Waveform (d) shows a slight exponential decay during interval T2 that results from charge transfer into the dielectrically isolated grid 36.

At the start of interval T2, signal S1 rises to 5.0 V and raises the gates of Q7 and Q8 to 5.0 V. Q7 turns on because the source of Q7 is coupled to N1 is at zero volts as stated above. Q8 remains off during T2. Its gate and source are both at 5.0 V. The gate of Q10 receives the RECALL OUTPUT SIGNAL from a source 180, not shown, and this signal, ROS remains at zero volts throughout the STORE sequence. Q10 is a depletion FET and is conductive, notwithstanding the fact that its gate is at zero volts. Q7 discharges C2 through Q10. Waveform (c) depicts the discharge of C2 (node N3) during the T2 interval. C1 retains its charge and the voltage on node N4 remains high. Waveform (d) in FIG. 2 shows the voltage on node N4.

The voltage of node N4 is substantially higher during interval T2 than the voltage of the node N3. This difference voltage results in a positive charge being placed on the dielectrically isolated grid 36 of the charge storage element Q14.

A net positive charge on the dielectrically isolated grid 36 of the charge storage element Q14 represents the state of the non-volatile element 22 for which node N3 has a lower potential than node N4, and this state corresponds also to the state of the volatile element 14 in which the potential of the first node N1 is lower than the potential of the second node N2 during a STORE sequence.

The third interval, T3, starts at 1.0 ms and ends at 1.1 ms and represents a wait interval until the start of the next successive partial store cycle. Each store cycle imparts an additional charge to isolated grid 36. An N-MOS embodiment would typically require nine or ten cycles to impart a sufficient charge change to isolated grid 36.

Waveform (e) in FIG. 2 schematically characterizes the successive shifts in the threshold voltage of sensing element Q13 in response to a reduction of negative charge from dielectrically isolated grid 36 by operation of non-volatile charge storage element 14. The shift in threshold voltage occurs during each successive T2 interval. The waveforms of FIG. 3 show four partial storage intervals, each partial storage interval having a corresponding T1, T2 and T3 interval. Waveform (e) in FIG. 2 shows the threshold voltage of Q13 being diminished from 3 V to approximately 1.6 V. In a typical system, nine or ten partial storage intervals would comprise the total storage interval and would decrease the threshold voltage of Q13 from +3.0 to approximately −1.5 V for the stored state in which N1 is low and N2 is high.

Figure 4:
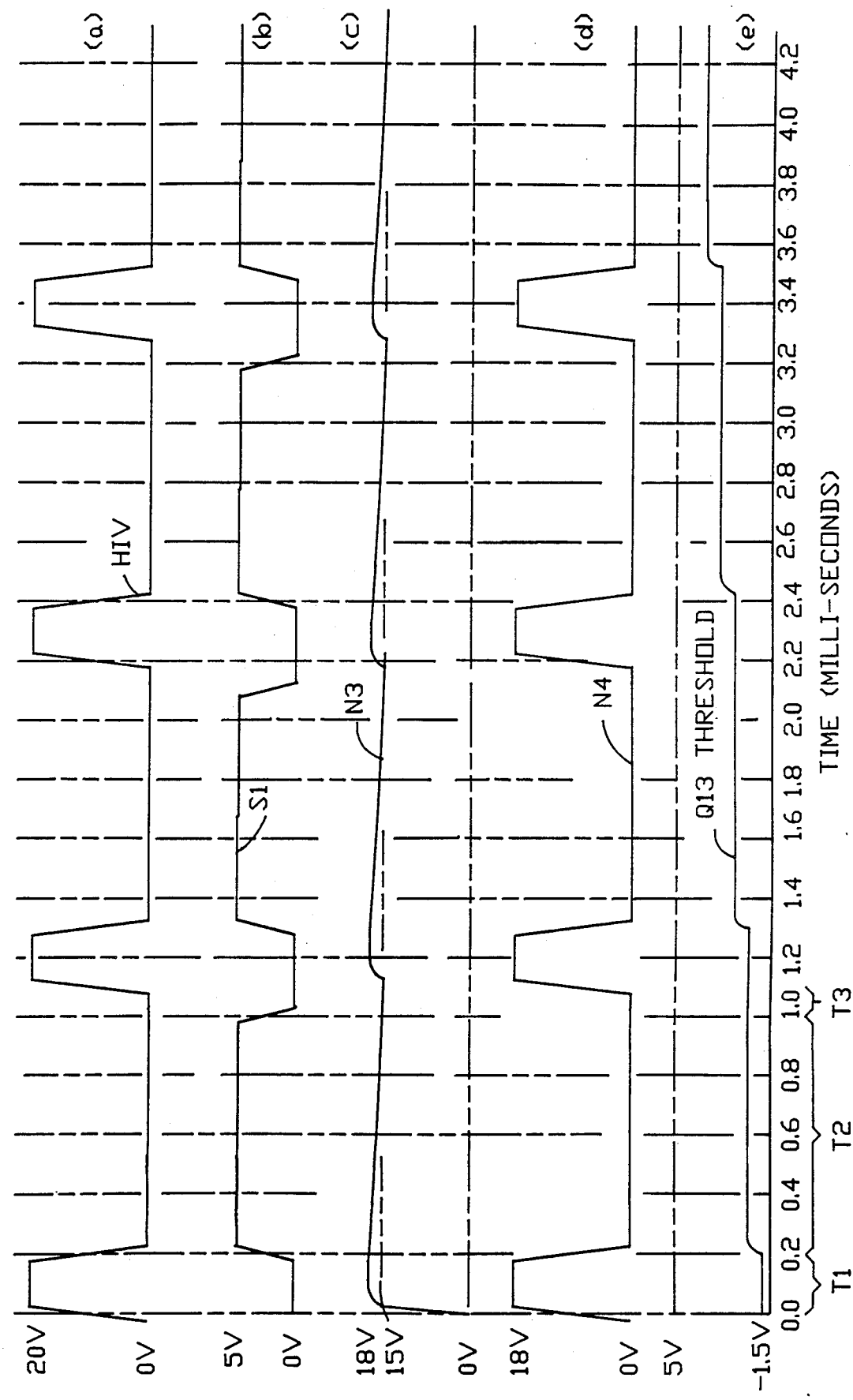
FIGS. 4(a)-4(e) are timing waveforms for the store cycle in which the flip-flop is initialized to store a LOGIC "1" and in which voltage amplitude is displayed vertically and time is displayed horizontally.
Figure 6:
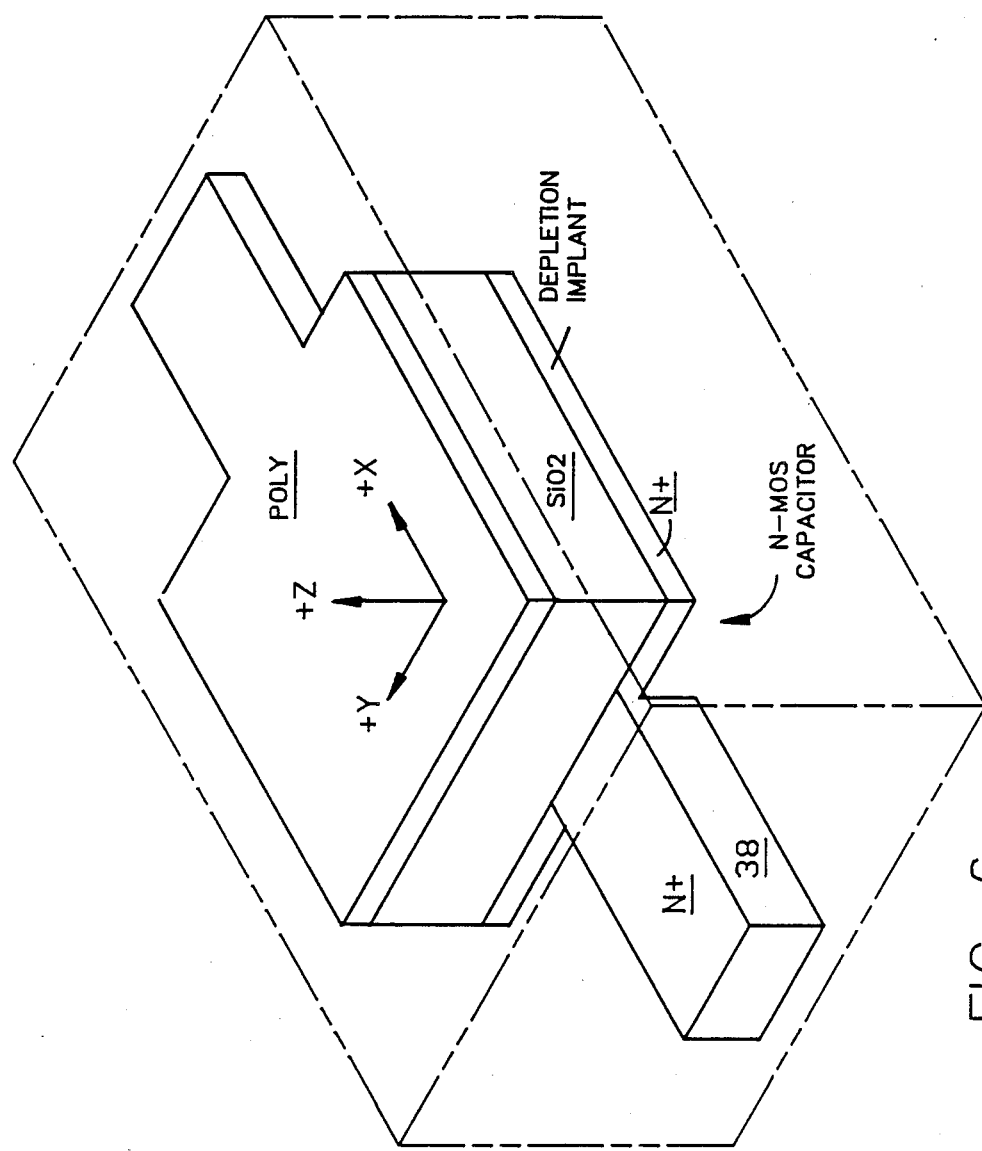
FIG. 6 is a schematic representation of a semiconductor capacitor structure embedded in a substrate.

FIG. 4 shows waveforms for a partial store cycle operation for which the VOLATILE MEMORY CELL 14 has been previously conditioned to store a logic "1". Waveform (a) again shows the electrical signal HIV provided by an external source 116 (not shown) to the gates of FETs Q15, Q16 of the RECTIFIER MEANS 67.

LOGIC "1" STORE SEQUENCE

Signal HIV assumes a high voltage of 20 V during a first interval T1 from t=0 to t=0.2 ms. Waveform (b) shows STORE signal S1 remaining at zero volts during T1 and rising to 5.0 V during the T2 interval. By way of example, assume that the VOLATILE RAM CELL 14 has been preconditioned to store a logic "1" and is in a stable condition with a logic "0" (0.0 V) at node N2 and a logic "1" (+5.0 V) at node N1.

Node N2 is common to the source 41 of Q8. FET Q8 is off (non-conductive) during the T1 interval because its gate 39 is at 0.0 Vdc by virtue of being coupled to STORE signal S1 waveform (b). Its source 41 is at 0.0 Vdc by virtue of its being coupled to node N2. With HIV at +20 V during T1, and with Q7 and Q8 acting as open switches, current flows via RECTIFIER MEANS 67 MOS rectifier Q15 and Q16 to node N3 and N4 driving the first plate 40 of capacitor C1 and the first plate of capacitor C2 to a positive voltage of one VTH below +20 V (typically 18 V). The rise in voltage of nodes N3 and N4 from 0.0 V to +18 V is characterized by waveforms (c) and (d) of FIG. 4 during this first 0.2 ms interval. The second plates 44 of MOS Capacitors C1 and C2 are at zero volts.

Since both first and second plates 38, 34 of the storage element Q14 are respectively coupled to the respective rise in voltage on C1 and C2 during T1, only a small voltage difference is developed between the first plate 38 and second plate 34 during this first 0.2 ms interval. Charge movement onto or off of dielectrically isolated grid 36 is not accomplished during this T1 interval.

FIG. 4 shows that signal HIV, waveform (a), returns to zero volts during a second interval T2 from 0.2 ms to 1.0 ms. STORE signal S1, waveform (b), is +5 V during this interval. Waveform (d) shows the voltage at node N4 at the end of interval T1 dropping from 18 V to 0.0 V in response to signal S1 rising from 0.0 V to 5.0 V at the start of interval T2. This drop in voltage results from signal S1, waveform (b) holding the gate of enhancement mode FET Q8 at +5.0 V during T2 while node N2 remains at 0.0 V. FET Q8 is driven into a conductive state by operation of S1. Node N4 is grounded through FETs Q8 and Q6. A conductive path is present from node N4, through the channel of Q8, through the channel of Q6 by way of which capacitor C1 is discharged.

Node N3 is substantially higher, in voltage, during interval T2, than the voltage of the node N4. No discharge path is provided for capacitor C2 since, as stated above, node N2 is at 0.0 $V_{dc}$ and this holds the gate of FET Q5 as ground forcing FET Q5 into a non-conductive state. A high voltage on node N3 results in a negative charge being placed on the dielectrically isolated grid 36 of the storage device Q14. Waveform (c) shows the voltage on node N3. A negative charge on the dielectrically isolated grid 36 of the non-volatile charge storage element Q14 represents the state of the NON-VOLATILE RAM element 22 for which node N4 has a lower potential than node N3. This state corresponds also to the state of the volatile element 14 in which the potential of the first node N1 is higher than the potential of the second node N2.

The fourth interval T3 starts at 1.0 ms and ends at 1.1 ms and represents a wait interval until the start of the next successive partial store cycle.

Waveform (e) in FIG. 4 schematically characterizes the successive positive shifts in the threshold voltage of sensing element Q13 in response to the transfer of negative charge onto dielectrically isolated grid 36. The shift in threshold voltage occurs during each successive T2 interval. FIG. 4 shows four partial storage intervals, each partial storage interval having a corresponding T1, T2 and T3 interval. Waveform (e) in FIG. 3 shows the threshold voltage of Q13 being increased from −1.5 V to approximately 2.1 V. In a typical system, nine or ten partial storage intervals would comprise the total storage interval and would increase the threshold voltage of Q13 from 1.5 V to approximately 3.0 V.

With the voltage at the third node N3 high and the voltage on the fourth node N4 low, negative charges move from the diffusion 38 of the transistor Q14 onto the dielectrically isolated grid 36. Keeping the high voltage across the storage element Q14 first and second plates for the intervals including T2 and T3 of approximately 0.9 milliseconds partially programs the dielectrically isolated grid 36. A negative charge on the dielectrically isolated grid 36 of the non-volatile storage element Q14 corresponds to the state of the non-volatile element in which the node N3 has a higher potential than does the node N4, which in turn corresponds to the state of the volatile RAM element 14 in which the node N1 has a higher potential than does the second node N2.

The charge on the dielectrically isolated grid 36 of the storage device Q14 of the charge storage memory 24 represents the stored state of the memory cell 10. That charge remains in place after power is removed from the cell circuit for an indefinite length of time. Therefore, the state of the non-volatile RAM element 22 is retained after the device containing the memory is powered down.

The Recall Operation

Figure 5:
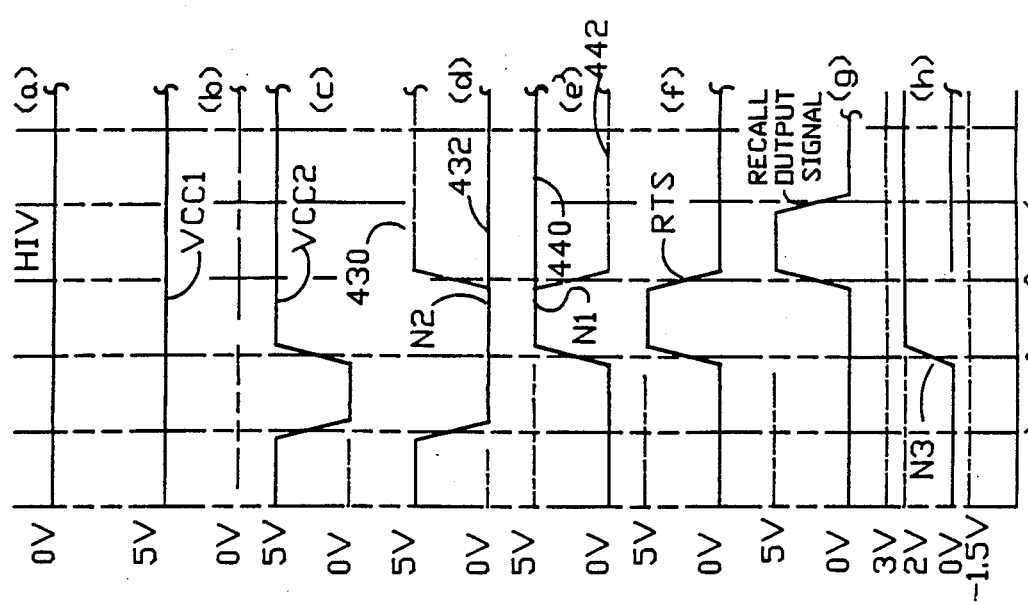
FIGS. 5(a)-5(h) are waveforms for the RECALL cycle in which voltage amplitude is displayed vertically and time is displayed horizontally.

Referring next to FIG. 5, waveforms for a recall cycle operation of the non-volatile memory RAM cell 10 are shown. A recall cycle is used to transfer the state of the non-volatile RAM element 22 to the volatile memory element 14. The HIV signal, waveform (a), remains at 0.0 V during the RECALL cycle. Waveform (b) shows the VCC1 signal provided by an external voltage supply (not shown) on the voltage supply line VCC1 connected to drain 15 of FET Q3. Waveform (c) shows the VCC2 signal provided by a convention signal source, such as that represented in FIG. 1 by the RESET SIGNAL MEANS block 180, sourcing a memory reset signal (VCC2) on signal line 118 to reset terminal 26, to the drain 13 of Q4 as shown in FIG. 2.

Referring to FIG. 5, waveform (d) shows the signal voltage at node N2 in response to application of signal VCC2 to the drain 13 of Q4. Waveform (e) shows the signal voltage at node N1 with VCC1 applying +5 to the drain 15 of Q3. Waveform (f) shows the RECALL TRANSFER SIGNAL (RTS) provided by an external source such as the RESET SIGNAL MEANS block 180 of FIG. 1 on signal line 55 to control the RECALL TRANSFER by switching the gate 26 of Q7 and the gate 39 of Q8 to +5 V in the transfer control circuit 16 of FIG. 1. Waveform (g) shows the RECALL OUTPUT SIGNAL rising from signal zero to +5.0 V. The RECALL OUTPUT SIGNAL (ROS) is sourced from the RESET SIGNAL MEANS block 180 to FIG. 1 via signal line 29 to the gates of RECALL FET Q11 and switch FET Q10. Q8 is off during this interval since ROS follows RTS in time.

To recall the state of the memory from the non-volatile RAM element 22 and place it into the volatile RAM cell 14 for general use and retrieval through the data lines DB and DB', the volatile RAM cell is first placed in a predetermined state with node N1 high and N2 low by operation of the VCC2 signal. The sensing element Q13 senses the state of the storage element Q14 and, in response, causes the volatile element to either remain in the established predetermined state, i.e. with N1 high, or to flip to the other stable state. Since Q13 can only provide a sink path to node N1, the predetermined state of the flip-flop is required to be a high or logic "1" at node N1.

During interval R1, the input voltage VCC2 is brought low for approximately one microsecond to force node N1 of the volatile element high and place the volatile element in its stable state. The second node N2 is low. During a subsequent interval, R2, the RTS signal on line 55 is brought high for approximately one microsecond to cause the transistor Q7 of the transfer control circuit 16 to be conductive.

The RTS signal voltage applied to the gate of Q7 drives it into conduction. FET Q10 is a depletion FET. Although the RECALL OUTPUT SIGNAL applied to the gate of Q10 is low (0.0 V) during the interval that the RTS signal is high (5.0 V), Q10 provides a conductive path from the source 26 of Q7 to node N3 and permits C2 to be charged by current passing from VCC1 through Q3, through Q7 and Q10. The voltage on node N3 rises until Q10 cuts off at $V_{TD}$, since signal ROS is holding the gate of Q10 grounded during this R2 interval.

C2 stores the charge required to hold the voltage at N3 at 2.5 V wheh S1 goes low cutting off the conductive path through Q7. During interval R3, ROS, the RECALL OUTPUT SIGNAL (waveform (g)) rises to +5 V and turns Q10 on but since RTS is then low, Q7 is off and the voltage at node 3 remains at approximately 2.5 V. It can be seen that the design size and thresholds of Q7 and Q10 and the size of C2 will influence the voltage that node N3 rises to. Waveform (h) in FIG. 5 depicts the rise in voltage of node N3. Conventional processing known in the art makes it possible to design Q7, Q10 and C2 to achieve the desired rise in voltage at node N3.

The charge on the dielectrically isolated grid 36 of the storage element Q14 is also present on the dielectrically isolated grid 32 of the sensing element Q13. The charge on the dielectrically isolated grid 32 affects the threshold voltage of the sensing transistor Q13. That effect on the threshold voltage is used to transfer the state of the charge storage memory 24 via Q7 to the volatile memory 14.

A negative charge on the dielectrically isolated grid 32, which corresponds to a negative charge on the dielectrically isolated grid 36 of the storage device Q14, raises the threshold voltage of the sensing transistor Q13 to greater than 3 V so the use in voltage of the node N3 signal FIG. 5 waveform (h) is insufficient to render the transistor Q13 conductive since a threshold of 3.0 V is not exceeded by a 2.5 V signal on the gate of Q13. Q13 would therefore remain non-conductive and would not alter the state of the flip-flop 14.

Conversely, a positive charge on the dielectrically isolated grid 32 lowers the threshold voltage of the device Q13 sufficiently (i.e. to less than −1.5 V) so that the S2 signal voltage applied to the node N3 ensures that the transistor Q13 is conductive. The positive charge applied during the STORE sequence is sufficient to turn the transistor Q13 on, but without consequence, since Q7 is not on at the same time.

The signal voltage at node N3 is applied to the control gate 30 of the sense element Q13. That bias voltage is either above or below the threshold for the transistor Q13. If the N3 signal voltage is below the threshold voltage of Q13 as the RECALL signal, waveform (g), goes high, transistor Q13 remains off, and the output terminal 20 to node N1 line 20 is not connected to ground.

FIG. 5 waveform (h) is observed to be more positive than −1.5 V at all times. However, the conductivity of the Q13 sense element is insufficient to sink sufficient current to alter the state of the flip-flop 14 when its threshold is at −1.5 V and its gate is at 0.0 V. In addition, Q11 is only conductive during the RECALL signal high interval.

If the N3 signal voltage applied to the control gate 30 is above the VTh threshold, transistor Q13 is turned on very hard. With transistor Q13 being driven hard into conduction and with Q11 also being driven into conduction during RECALL, the output terminal line 20 is brought low to ground potential and flip-flop 14 is reset to a logic "0".

As was discussed above, a negative charge stored on the dielectrically isolated grid 36 of the storage device Q14 occurs during a store sequence in which the node N3 is at a higher potential than the node N4, which corresponds to the volatile memory state in which the potential of the node N1 is higher than the potential of the node N2. Thus, it is seen that state of the volatile element stored in the non-volatile memory is restored to the volatile element flip-flop 14.

If the sense transistor Q13 is on when the gate transistor Q7 is rendered conductive in response to the RTS signal, the sense output terminal 20 is connected to the ground potential as Q11 is driven into conduction during RECALL, the first node N1 is pulled low, and the volatile element 14 is flipped from its pre-established state to a stable logic "0" state in which N1 remains low.

The storage of a positive charge on the dielectrically isolated grid 36 of the storage device Q14 represents the state in which the potential of the node N4 is higher than the potential of the node N3 in the non-volatile element, which corresponds to the state of the volatile element in which the node N2 has a higher potential than the node N1, i.e. a logic "0" state. Thus, it is seen that the logic "0" state stored in the charge storage element Q14 is restored to the volatile element 14 during the recall operation.

I claim:

1. A memory cell circuit for storing and recalling the first or second state of a digital signal on a data bus in response to being addressed by an address signal on an address bus;

said memory cell circuit having a store cycle, each store cycle having a repeating series of recurring store cycle sequences;

each store cycle sequence being controlled by an HIV (High Voltage) Signal during a first interval, and a STORE SIGNAL during a second timing interval from a timing signal source;

said memory cell circuit also having a recall cycle, each recall cycle being controlled by a MEMORY RESET SIGNAL (VCC2) from a memory reset signal source, to preset the state of the aemory cell circuit during a first interval, a RECALL TRANSFER SIGNAL from a recall transfer signal source, and a RECALL OUTPUT CONTROL SIGNAL from a recall output control signal source in a second and third reset signal interval to control the recall timing sequence, the memory cell comprising:

a VOLATILE RAM CELL having:
a flip-flop having first and second nodes at which complementary output signals are provided; said output signals having a first or second stable state corresponding to the state of the data bus in response to an address signal on the data bus;

said flip-flop also having a SET TERMINAL responsible to a set signal for forcing the flip-flop to assume a predetermined state coupled to said first node and a RESET TERMINAL responsive to said RESET SIGNAL for forcing the flip-flop to assume a predetermined state;

a NON-VOLATILE RAM element having;
a first capacitor coupled between a third node and a reference potential;
a second capacitor coupled between a fourth node and a reference potential;
first and second rectifier means responsive to said HIV signal at the onset of each stored timing signal sequence for simultaneously precharging said first and second capacitors during the first timing interval of each store cycle sequence; and
transfer control circuit means responsive to each STORE SIGNAL for discharging said first capacitor in response to said flip-flop output being in a first state and for discharging said second capacitor in response to said flip-flop being in a second state;

said NON-VOLATILE RAM element also having;
a charge storage memory having a OUTPUT TERMINAL and being responsive to the charge state of said first and second capacitors for storing a state corresponding to the state of said flip-flop into a non-volatile charge storage element;
said charge storage memory being responsive to said RECALL TRANSFER SIGNAL in said recall timing sequence to provide said SET SIGNAL, said SET SIGNAL having a state corresponding to the stored state of said non-volatile storage element;
said transfer control circuit means being responsive to said RECALL OUTPUT CONTROL SIGNAL for coupling said SET SIGNAL to said first node to set the state of said flip-flop during said recall timing signal sequence to a state corresponding to the state of said non-volatile storage element.

2. The memory cell circuit of claim 1 wherein said charge storage memory NON-VOLATILE charge storage element further comprises:
a dielectrically isolated grid having a charge of a first plurality established in response to said first capacitor being charged and said second capacitor being discharged during the second timing interval of each recurring store cycle sequence;
said dielectrically isolated grid having a charge of a second plurality established in response to said first capacitor being discharged and said second capacitor being charged during the second timing interval of each store cycle sequence;
the polarity of the charge on the dielectrically isolated grid characterizing the stored state of the NON-VOLATIVE RAM element;
said transfer control circuit being further characterized in a recall sequence to be responsive to said RECALL TRANSFER SIGNAL to couple a transfer voltage from said flip-flop node to said second capacitor; and
a sense element means responsive to a transfer voltage on said second capacitor signal and to the charge state on said dielectrically isolated grid for providing said set signal having a state corresponding to the storage state of said NON-VOLATILE RAM element to said OUTPUT TERMINAL.

3. The memory cell circuit of claim 2 wherein said NON-VOLATILE CHARGE STORAGE ELEMENT within said CHARGE STORAGE MEMORY further comprises:
a dielectrically isolated grid,
a first plate and a second plate, said first plate being connected to third node and said second plate being connected to fourth node.

4. The memory cell circuit of claim 3 wherein said sense element further comprises;
a floating gate MOSFET having a floating gate connected to the dielectrically isolated grid of said NON-VOLATILE CHARGE STORAGE ELEMENT, the gate of said floating gate MOSFET being coupled to node 3, the conductor channel of said floating gate MOSFET being coupled between referenced potential and said SET TERMINAL.

5. The memory cell circuit of claim 1 wherein said NON-VOLATILE RAM element first and second rectifier means further comprises:
first and second field effect transistors, said first and second field effect transistor gates and drains being electrically common and being coupled to receive said HIV signal, said first field effect transistor source being coupled to said third node and said second field effect transistor source being coupled to said fourth node.

6. The memory cell circuit of claim 1 wherein said CHARGE STORAGE MEMORY provides said set signal at said non-volatile RAM element output terminal; and wherein,
said transfer circuit couples said set signal from the non-volatile element output terminal to the SET TERMINAL in response to said RECALL OUTPUT CONTROL SIGNAL.

7. The memory cell circuit of claim 1 wherein said transfer control circuit means being responsive to each STORE SIGNAL further comprises:
a first conduction channel for coupling node 3 to node 1; and
a second conduction channel for coupling node 4 to node 2.

8. The memory cell circuit of claim 7 wherein said TRANSFER CONTROL CIRCUIT MEANS first conduction channel further comprises:
an insulated gate MOSFET having a conduction channel in series with the conduction channel of a depletion mode MOSFET, said insulated gate MOSFET source being coupled to node 1, said insulated gate MOSFET drain being coupled to the source of said depletion mode MOSFET, the drain of said depletion mode MOSFET being coupled to node 3; and wherein
said transfer control circuit second conduction channel further comprises an insulated gate MOSFET having its source coupled to node 2 and its drain coupled to node 4;
the gates of said first conduction channel insulated gate MOSFET and said second conduction channel insulated gate MOSFET being common and coupled to receive said STORE SIGNAL from said said store signal source during a store signal sequence, and said recall transfer signal from said recall transfer signal source during a recall sequence.

9. The memory cell circuit of claim 8 wherein the gate of said transfer control circuit means insulated gate MOSFET, for coupling said non-volatile element output terminal to said set terminal, is common to the gate of said transfer control circuit first conduction channel depletion mode FET and is coupled to receive said recall output control signal.

* * * * *